United States Patent [19]

Khanna et al.

[11] Patent Number: 4,522,844

[45] Date of Patent: Jun. 11, 1985

[54] CORROSION RESISTANT COATING

[75] Inventors: Satish K. Khanna; Anilkumar P. Thakoor, both of Pasadena; Roger M. Williams, Azusa, all of Calif.

[73] Assignee: The United States of America as represented by the Administrator, National Aeronautics and Space Administration, Washington, D.C.

[21] Appl. No.: 537,616

[22] Filed: Sep. 30, 1983

[51] Int. Cl.³ .............................................. C23C 15/00
[52] U.S. Cl. ...................................... 427/38; 427/47; 204/192 N
[58] Field of Search ............................ 427/38, 39, 47; 204/192 R, 192 C, 164, 192 N

[56] References Cited

U.S. PATENT DOCUMENTS 4,094,764  6/1978  Boucher et al. ................. 204/192 N
4,108,751  8/1978  King ................................. 204/192 N Primary Examiner—John H. Newsome
Attorney, Agent, or Firm—Paul F. McCaul; John R. Manning; Thomas H. Jones

[57] ABSTRACT

Disclosed is a method of coating a substrate with an amorphous metal comprising the step of bombarding a solid piece of the metal with ions of an inert gas in the presence of a magnetic field to provide a vapor of the metal which is deposited on the substrate at a sufficiently low gas pressure so that there is formed on the substrate a thin, uniformly thick, essentially pinhole-free film of the metal.

13 Claims, 6 Drawing Figures

CORROSION RESISTANT COATING

BACKGROUND OF THE INVENTION

1. Origin of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

2. Field of the Invention

This invention relates to a method of applying a thin film of amorphous metal to a substrate, and in particular a method for applying the film at a sufficiently low pressure so that the film is essentially devoid of microstructure such as columns, voids, pinholes, etc. and is homogeneous, uniform, dense and exhibits a smooth mirror-like surface finish.

3. Background Discussion

To minimize corrosion, many metal parts are coated with, for example, chrome which is a corrosion-resistant metal. Nevertheless, these chrome plated parts are still subject to corrosion and it costs several billions of dollars annually to combat or replace corroded equipment.

SUMMARY OF THE INVENTION

We have invented a method for coating substrates with an amorphous metal (as used herein metal means metal and metal alloys) so that there is applied to the substrate a thin, uniform, essentially pinhole-free film. The pinhole-free film is dense and mirror-smooth. Essentially any substrate of any shape may be coated using our method. Glass, metal, ceramic and plastic are the most common substrates. According to this method, a solid piece of the amorphous metal, which serves as the target, is bombarded with ions derived from an inert gas plasma. The bombarding of the target takes place in the presence of a magnetic field near the target. The bombardment of the piece of metal produces vapor of the metal which is deposited on the substrate. Deposition of the vapor is conducted at a very low pressure sufficient to form the desired uniform, dense, pinhole-free film. Typically the gas pressure is no greater than about 10 micrometers. We have found that at higher pressures, or if the gas constituents react with the metal, the desired pinhole-free film is not formed. If, on the other hand, there are no reactive gases present and the gas pressure is low, a thin, uniform, homogeneous, essentially pinhole-free film is formed on the substrate. The combination of the substrate coated with such film also is a novel article of manufacture.

The amorphous metal is generally an alloy of one or more transition metals and metalloids. The transition metals are selected from the group scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium and platinum. The metalloids are selected from the group consisting of silicon, boron, carbon, germanium and phosphorus. Specific alloys employed included $(Mo_{0.6}Ru_{0.4})_{82}B_{18}$; $(Mo)_{82}B_{18}$; and $(W_{0.6}Re_{0.4})_{76}B_{24}$.

This invention has several advantages. First, there is provided a highly corrosion resistant, thin film which protects the substrate. Second, a wide variety of amorphous metals may be employed and they need not be first melted, but may simply be mixed thoroughly together in the solid state. In accordance with our method, these solid materials will be vaporized by ion bombardment and form a metal film on the substrate. Third, the film so formed will always be of a single phase. This improves corrosion resistance because there will not be an electrochemical potential between different segments of the film which might be a source of corrosion. Fourth, the film so formed, if it is subjected to corrosion, will corrode uniformly without pitting or crevice corrosion. This is in contrast to, for example, stainless steel, which when corrosion begins, forms a pit or puncture which serves as the site for the expanding corrosive action.

DETAILED DESCRIPTION OF THE DRAWING

Figure 1:
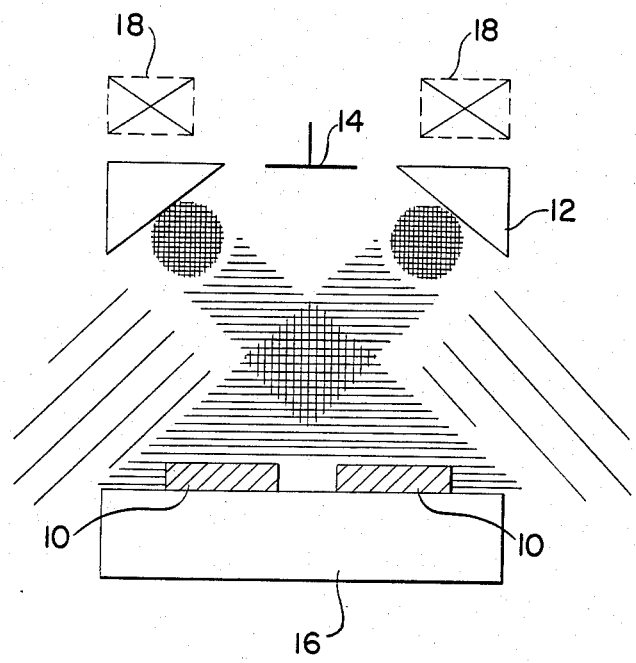
FIG. 1 is a schematic illustration of the method of our invention.

As illustrated in FIG. 1, a substrate 10 is coated with a thin film of amorphous metal by employing the magnetron sputtering process. A target 12 of the amorphous metal disposed in a vacuum chamber (not shown) is bombarded with positive ions. The ions are formed by imposing a high voltage across an anode 14 adjacent the target 12. A cathode 16 holds the substrate 10, which in effect is also the cathode because it is in electrical contact with it. When the potential is applied across the anode 14 and cathode 16, the gas in the chamber ionizes. The preferred gas is argon. Upon ionization electrons are liberated and the positively charged argon ion strikes the surface of the target 12. There is an exchange of momentum, the argon ion moving at a high velocity knocks out atoms of the metal from the surface of the target. The knocked out atoms of the metal essentially constitute a vapor beam, which is carried to the surface of the substrate and deposited on the surface. The presence of a magnet 18 adjacent to the target 12 provides a magnetic field which serves to trap the secondary electrons near the cathode 16. The absence of the magnet 18 would result in the electrons reaching to the substrate and excessively heating it. This would be undesirable, especially if a plastic substrate was being coated. In accordance with this invention, the method is carried out at a very low pressure sufficient to form a film which is essentially pinhole-free. Typically the pressure will be no greater than 10 micrometers of mercury and preferably is about 2 micrometers of mercury or less. The magnetron sputtering process is disclosed in detail in *Thin Film Processes,* edited by J. L. Vossen and W. Kern (Academic, New York, 1978), p. 60.

The following is a specific example of the method of our invention and an article of manufacture produced by this method.

EXAMPLE $(Mo_{0.6}Ru_{0.4})_{82}B_{18}$ films were deposited onto clean glass slides by dc magnetron sputtering in dry argon from a water-cooled composite target using an S-gun sputtering system (Sputter Films, Inc.). A hydrocarbon-free, turbomolecular-pumped vacuum system was initially pumped down to a base pressure of $\sim 5 \times 10^{-7}$ Torr, and flushed with dry argon gas several times before dynamically maintaining the chamber at the desired sputtering pressure. A large capacity liquid-nitrogen-cooled trap, resulting in pumping speed of 900 liters/sec, was provided in the sputtering chamber.

The target was fabricated by hot-pressing a mixture of high-purity Mo, Ru, and B powders in the desired proportion. The target was preconditioned by sputtering at constant rate and constant, usually 5 micrometer ($\mu$m), Ar pressure. Chemical composition of the films was determined by using energy dispersive spectroscopy (EDS) and ion microprobe (Cameca, Inc.). The composition of several initial deposition runs was monitored to verify that the preconditioning of the target was complete. After about 100-$\mu$m erosion of the target surface, the target had completely equilibrated itself with the sputtering conditions so as to yield the same chemical composition throughout the thickness of the film and in films deposited in subsequent runs. In addition, in each deposition run the target was presputtered for several minutes onto the shutter prior to deposition onto the substrates.

Two to four $\mu$m-thick films were deposited in varying pressures of pure Ar, Ar and $O_2$ mixture, or Ar and $N_2$ mixture. The substrates were clamped onto a water-cooled copper block with a thin layer of vacuum grease to assure good thermal contact. The temperature of the substrates was monitored by a copper constanta thermocouple, and was found to rise only a few degrees above room temperature during deposition under steady-state conditions. A typical rate of deposition was $\sim 350$ Å/min onto substrates held $\sim 15$ cm away from the target, for $\sim 500$-W dc power applied to the target. The films were checked for crystallizing and short range structure by X-ray diffraction. Their surface morphology and tensile fracture cross-sections were observed at different tilt angles by using scanning electron microscopy (SEM). Corrosion behavior of the films was studied by potentiostatic and potentiodynamic techniques in 1N $H_2SO_4$ and other corrosive solutions. The potentio-dynamic polarization curves were recorded by using Ag/AgCl reference electrodes and 10 mV/sec scan rate, and potential static corrosion rates were determined by measuring current flow after holding the potential constant for 20 minutes to three hours.

A. Composition

Figure 2:
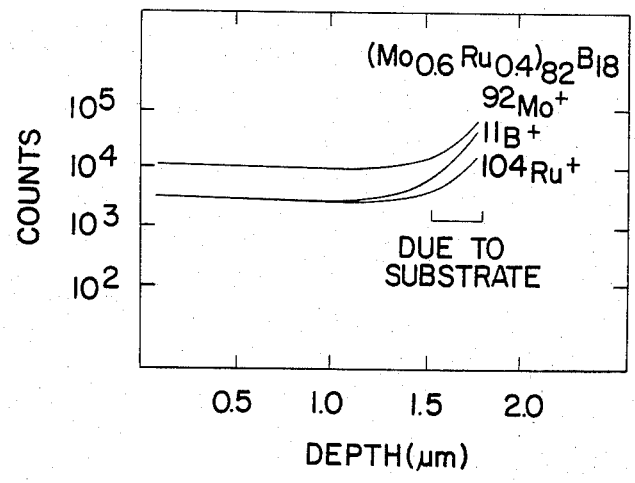
FIG. 2 is a graph illustrating the composition of the film as a function of film thickness.
Figure 3A:
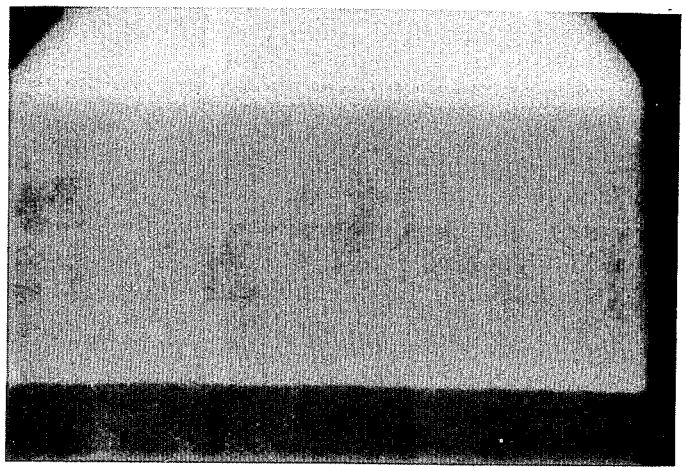
FIG. 3A is a micrograph of a substrate coated with an amorphous metal film at low pressure according to our invention.

FIG. 2 shows a depth profile of the chemical composition measured using ion microprobe for a film deposited under 5 $\mu$m pressure of Ar, whose scanning electron micrograph is shown in FIG. 3(A). The uniformity of the composition throughout the film thickness is remarkable. Since composition is an important parameter affecting chemical corrosion, it was verified whenever a new film was deposited under altered sputtering conditions.

B. Structure

Figure 3B:
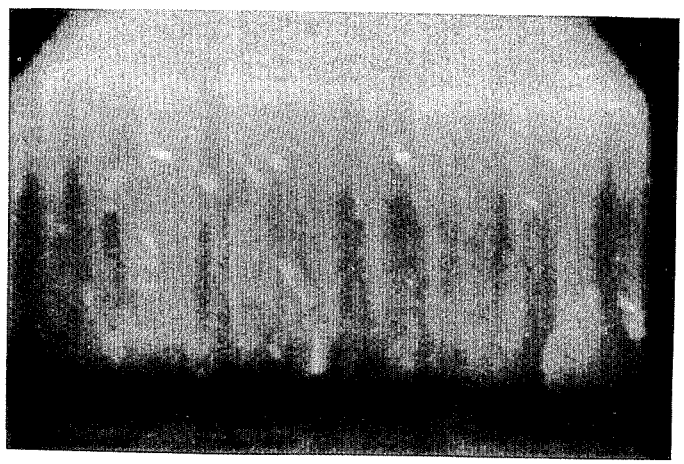
FIG. 3B is a micrograph of a substrate coated with an amorphous metal film at high pressure.

The film deposited at 5-$\mu$m-Ar pressure has an extremely smooth surface and almost featureless tensile fraction cross-section, as shown in the SEM picture in FIG. 3(A). The surface roughness increased rapidly with increasing Ar pressure, and the film cross-section showed a dense but distinct vertical columnar structure as shown in FIG. 3(B). This film was deposited at $\sim 35$-$\mu$m-Ar pressure. It must be mentioned here that the films deposited at as high as 75-$\mu$m-Ar pressure were nevertheless observed to be amorphous according to X-ray diffraction. The rate of deposition, however, decreased drastically with increasing Ar pressure.

Figure 3C:
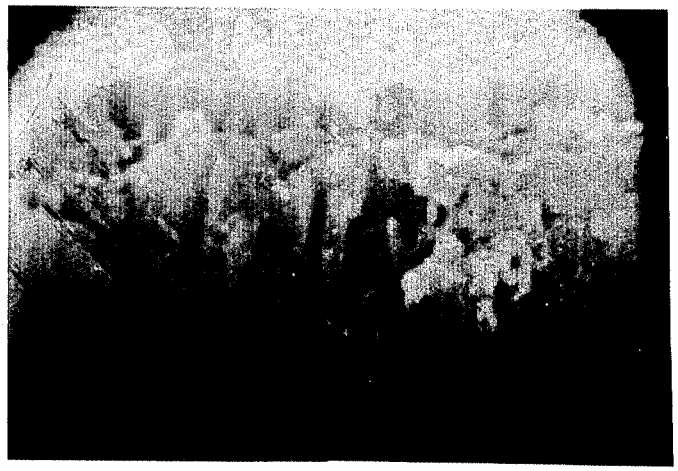
FIG. 3C is a micrograph of a substrate coated with an amorphous metal film in the presence of oxygen.

Amorphous films deposited under the mixture of $\sim 5$ $\mu$m of Ar and $\sim 2$ $\mu$m of $O_2$ exhibited highly developed zone structure with poorly bonded vertical columns, large voids, and dispersed surface mounts. The lumpy top surface and multiply cracked fracture cross-section of such a film are shown in FIG. 3(C). Increased pressure in the chamber, due to the introduction of oxygen, contributed to the oblique flux component. The ion microprobe analysis of these films did not show any appreciable amount of oxygen in them.

Figure 3D:
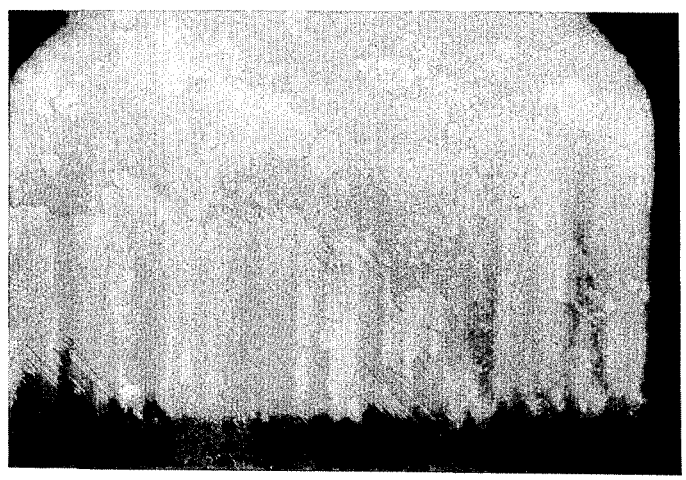
FIG. 3D is a micrograph of a substrate coated with an amorphous metal film in the presence of nitrogen.

On the other hand, the X-ray diffraction pattern of the film deposited under $\sim 5$-$\mu$m-Ar and $\sim 2$-$\mu$m-$N_2$ mixture showed several diffraction peaks superimposed onto the broad halos characteristic of the amorphous structure. Although it appears that the films might have some segregated regions as crystalline inclusions, the diffraction pattern lacks the required clarity for any unambiguous and meaningful identification. The films deposited in argon-nitrogen mixture exhibited a void-free and dense vertical columnar structure in their fracture cross-section as shown in FIG. 3(D).

The above description presents the best mode contemplated of carrying out the present invention. This invention is, however, susceptible to modifications and alternate constructions from the embodiments shown in the drawing and described above. Consequently, it is not the intention to limit this invention to the particular embodiments disclosed. On the contrary, the intention is to cover all modifications and alternate constructions falling within the spirit and scope of the invention as expressed in the appended claims.

What is claimed is:

1. A method of providing a substrate with a thin, corrosion-resistant coating comprising the steps of:
   (a) selecting one or more transition metals;
   (b) selecting one or more metalloids;
   (c) thoroughly mixing said metals and metalloids to form a solid material in the shape of a target suitable for deposition sputtering;
   (d) bombarding the target with ions of an inert gas in the presence of a magnetic field to provide a vapor of the target material and deposit the vaporous target material onto the substrate; and
   (e) maintaining the pressure of the gas sufficiently low to cause the target material to deposit onto the substrate in a thin, uniformly thick, essentially pinhole-free amorphous metallic alloy film.

2. The method of claim 1 wherein the metal is selected from the group scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium and platinum and the metalloids are selected from the group consisting of silicon, boron, carbon, germanium and phosphorus.

3. The method of claim 1 wherein the gas pressure is no greater than about 10 micrometers of mercury.

4. The method of claim 1 wherein the target material is $(Mo_{0.6}Ru_{0.4})_{82}B_{18}$; $(Mo)_{82}B_{18}$; or $(W_{0.6}Re_{0.4})_{76}B_{24}$.

5. The method of claim 1 wherein the substrate is glass, plastic ceramic, or metal.

6. The method of claim 1 wherein the bombarding is conducted in an electric field which ionizes the inert gas.

7. The method of claim 6 wherein the electric field is established between an anode and a cathode, with the target being positioned adjacent the anode.

8. The method of claim 1 wherein the substrate is cleaned prior to applying the thin film.

9. The method of claim 1 wherein the metal piece is cleaned by bombarding the substrate with ions of the inert gas.

10. A method of coating a substrate with a corrosion-resistant coating comprising the steps of: (a) selection one or more transition metals from the group consisting of scandium, yttrium, lanthanum, titanium, zirconium, hafnium, vanadium niobium, tantalum, chromium, molybdenum, tungsten manganese, technetium, rhenium, iron, ruthenium, osmium, cobalt, rhodium, iridium, nickel, palladium and platinum; (b) selection one or more metalloids from the groups consisting of silicon, boron, carbon, germanium and phosphorus; (c) mixing the selected transition metals and metalloids together; (d) pressing the mixture of selected metals and metalloids into a solid shape in the form of a target; (e) surrounding the target and substrate with an inert gas having a pressure no greater than about 10 micrometers of mercury; and (f) bombarding the target with ions of the inert gas in the presence of a magnetic field to provide a vapor of the target material and deposit the vaporous target material onto the substrate in a thin, uniformly thick, essentially pinholefree amorphous metallic alloy film.

11. The method of claim 10 wherein the target material is one of $(Mo_{0.6}Ru_{0.4})_{82}B_{18}$; $(Mo)_{82}B_{13}$ and $(W_{0.6}Re_{0.4})_{76}B_{24}$.

12. The method of claim 10 wherein the target is bombarded with ions until the coating is about 2 to 4 micrometers thick.

13. The method of claim 10 wherein the inert gas is argon and the pressure of said gas is maintained at about 5 to 10 micrometers of mercury.

* * * * *